United States Patent
Mitani

(10) Patent No.: US 7,745,936 B2
(45) Date of Patent: Jun. 29, 2010

(54) SEMICONDUCTOR INTEGRATED CIRCUIT DEVICE

(75) Inventor: Hitoshi Mitani, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/164,507

(22) Filed: Jun. 30, 2008

(65) Prior Publication Data

US 2009/0001497 A1    Jan. 1, 2009

(30) Foreign Application Priority Data

Jun. 28, 2007    (JP) .............................. 2007-170442

(51) Int. Cl.
*H01L 23/48* (2006.01)

(52) U.S. Cl. .................................. 257/758; 257/E23.18

(58) Field of Classification Search .................. 257/79, 257/59, 435, 681, E23.18, 666, 680, 750, 257/758, 700, 704, 774

See application file for complete search history.

(56) References Cited

U.S. PATENT DOCUMENTS

2007/0222043 A1 *    9/2007    Watanabe et al. ............ 257/666

FOREIGN PATENT DOCUMENTS

| JP | 5-38915 | 5/1993 |
|----|---------|--------|
| JP | 7-66378 | 3/1995 |
| JP | 2003-124363 | 4/2003 |
| JP | 2006-154217 | 6/2006 |
| JP | 2006-154317 | 6/2006 |

* cited by examiner

*Primary Examiner*—Ngan Ngo
*Assistant Examiner*—Hoa B Trinh
(74) *Attorney, Agent, or Firm*—Young & Thompson

(57) ABSTRACT

A semiconductor integrated circuit device includes a substrate having a PROM formed thereon in which the data memory state of the PROM is changed by the irradiation of light, and a multilayer wiring structure formed on the same side of the substrate as the PROM is formed. The multilayer wiring structure includes a transparent area, a shield area, and a PAD portion. The transparent area is formed from transparent material at a position opposite to the PROM area where the PROM is formed, and used as a light guiding path from the outside of the multilayer wiring structure to the PROM. The shield area is formed continuously from shielding materials arranged in several layers in the periphery of the transparent area. The PAD portion is formed on the outside of the shield area in regard to the transparent area, and controls the memory state of the PROM.

9 Claims, 5 Drawing Sheets

SEMICONDUCTOR INTEGRATED CIRCUIT DEVICE

BACKGROUND OF THE INVENTION

1. Field of the Invention

The present invention relates to a semiconductor integrated circuit device.

2. Description of Related Art

In a conventional semiconductor integrated circuit device which is used for an LCD (Liquid Crystal Display) driver, a semiconductor chip is directly connected, through a metal bump, on a glass substrate (which is called "LCD substrate" hereinafter), on which an LCD is mounted. FIG. 8 shows a plan view of an LCD substrate 1000, on which an LCD panel 1001 and a semiconductor integrated circuit device 1002 for use in an LCD driver are mounted. As shown in FIG. 8, in general, the semiconductor integrated circuit device 1002 for use in an LCD driver is mounted near the LCD panel 1001 where it is exposed to outside light. Therefore, the semiconductor integrated circuit device 1002 for use in an LCD driver may be directly or indirectly irradiated by outside light.

Meanwhile, as shown in FIG. 8, the semiconductor integrated circuit device 1002 for use in an LCD driver may contain a program circuit 1003 (which is called "PROM area" hereinafter) having a PROM (Programmable Read Only Memory). The PROM area 1003 can be used by a set maker, i.e., customer, to write set maker data (customer data) such as an arbitrary ID number. In such situation, the PROM is required to retain the written data. However, if the semiconductor integrated circuit device 1002 for use in an LCD driver is exposed to outside light, the outside light may irradiate the PROM area 1003 and erase the customer data recorded in the PROM. Therefore, the PROM area 1003 needs to be shielded from the light.

Accordingly, Japanese Unexamined Patent Application Publication No. 2006-154317 describes a display device in which a shield member is arranged over EPROM (Erasable Programmable Read Only Memory) mounted on an LCD substrate. Furthermore, Japanese Unexamined Utility Model Application Publication No. 05-038915 describes a technique in which a shield film is arranged over an EPROM memory cell on a semiconductor integrated circuit to cover the EPROM. Furthermore, Japanese Unexamined Patent Application Publication No. 07-066378 describes a technique in which a shield film having an exposure window over EPROM is provided, so that an operation threshold, of the transistors in the EPROM, which may be deteriorated during the formation process of the shield film, can be recovered by radiating ultraviolet light through the exposure window. Incidentally, the exposure window is covered by a light-blocking insulating film after the recovery of the operation threshold of the transistors in the EPROM. Furthermore, Japanese Unexamined Patent Application Publication No. 2003-124363 describes a technique in which a shielding film is arranged over EEPROM (Electronically Erasable and Programmable Read Only Memory). In addition, a contact plug and a via plug are also arranged around the EEPROM area to prevent outside light from being radiated from the lateral side of the EEPROM area.

However, in the above-explained semiconductor integrated circuit device in the related art, the PROM is shielded by the shield film, and the like, when the PAD portion is formed. Therefore, once a writing test is carried out for the PROM through the PAD portion, the written data cannot be erased by irradiating ultraviolet light to the PROM. Accordingly, in a semiconductor integrated circuit device in the related art, the writing test of a PROM cannot be carried out during the manufacturing process.

Therefore, a PROM mounted in a semiconductor integrated circuit device in the related art can only be used as a one-time programmable device (which is called "OTP device" hereinafter). As explained above, since a writing test of a PROM is not carried out in a semiconductor integrated circuit device in the related art, more than required number of PROMs (OTP devices) need to be formed in the semiconductor integrated circuit device. Because it contains more than required number of PROMs (OTP devices), even if one PROM (OTP device) is defective, another PROM (OTP device) can substitute for the defective one.

However, the total number of IDs required by a customer has been increasing, and sometimes it reaches to several hundred to several thousand bits Depending on defective rate, several ten to several hundred bits of PROMs (OTP devices) need to be formed in a semiconductor integrated circuit device. Consequently it has become an obstacle to the miniaturized design of semiconductor integrated circuit device.

SUMMARY

In accordance with one embodiment of the present invention, a semiconductor integrated circuit device includes a substrate having a semiconductor memory element formed thereon in which the data memory state of the semiconductor memory element is changed by the irradiation of light, and a multilayer wiring structure formed on the same side of the substrate as the semiconductor memory element is formed. The multilayer wiring structure includes a transparent area, a shield area, and an electrode. The transparent area is formed from transparent material at a position opposite to an element area where the semiconductor memory element is formed, and used as a light guiding path from the outside of the multilayer wiring structure to the semiconductor memory element. The shield area is formed continuously from shielding materials arranged in several layers in the periphery of the transparent area. The electrode is formed on the outside of the shield area in regard to the transparent area, and controls the memory state of the semiconductor memory element. In this manner, since the transparent area, which is used as the light guiding path, is not shielded just after the formation of the electrode, the erase operation can be carried out by irradiating light to the semiconductor memory element after tentative writing operation is carried out to the semiconductor memory element through the electrode. That is, writing test can be carried out to the semiconductor memory element, for which a shielding measure should be taken. Therefore, writing test of the semiconductor memory element can be carried out during the manufacturing process of the semiconductor integrated circuit device. Accordingly, since the writing test can be carried out, only the required number of semiconductor memory elements need to be formed in the semiconductor integrated circuit device, and thereby enabling the miniaturized design of the semiconductor integrated circuit device.

The present invention in one aspect enables the data erasing of a semiconductor memory element, for which a shielding measure should be taken, by the irradiation of ultraviolet light, and thereby allows the writing test of the semiconductor memory element to be carried out. Consequently, it makes a contribution to shrink the chip size of semiconductor integrated circuit device.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments to which the present invention is applicable are explained hereinafter. However, the present invention is not limited to those embodiments. Furthermore, a semiconductor integrated circuit device in accordance with one example of the present invention is suited, for example, for a semiconductor integrated circuit device used for an LCD (Liquid Crystal Display) driver mounted near an LCD panel on an LCD substrate. Furthermore, a semiconductor integrated circuit device in accordance with one example of the present invention comprises a photoresponsive device or a semiconductor memory element wherein the data memory state of the semiconductor memory element being changed by the irradiation of light. The photoresponsive device includes a PROM (Programmable Read Only Memory). In the following explanations, the photosensitive device is explained as a PROM. However, the present invention is not limited to embodiments using a PROM.

First Embodiment

Figure 1:
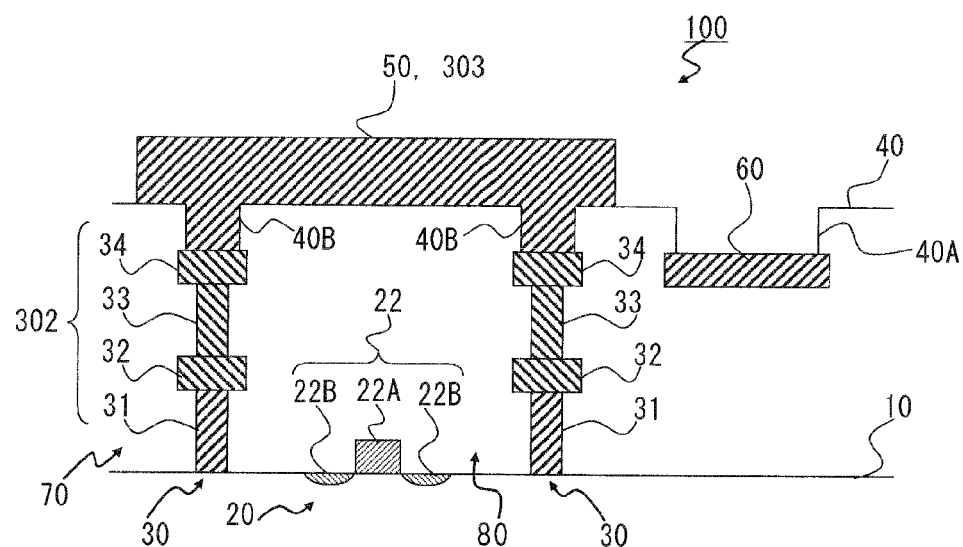
FIG. 1 is a side cross-sectional view showing the general structure of a semiconductor integrated circuit device in accordance with a first embodiment of the present invention.
Figure 2:
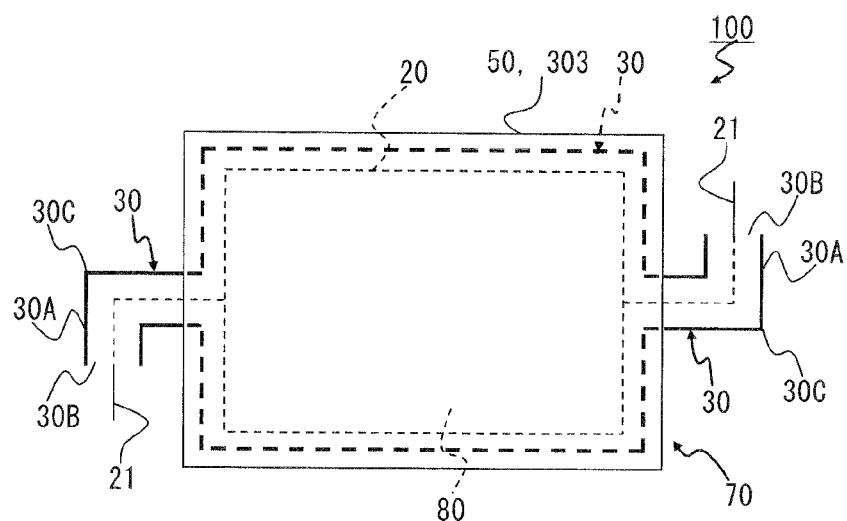
FIG. 2 is a plan view, viewed from the ultraviolet light irradiated side, of the semiconductor integrated circuit device in accordance with the first embodiment of the present invention.

A semiconductor integrated circuit device 100 in accordance with a first embodiment of the present invention is explained hereinafter with reference to FIGS. 1 and 2. FIG. 1 is a side cross-sectional view showing the general structure of a semiconductor integrated circuit device 100 in accordance with a first embodiment of the present invention. FIG. 2 is a plan view, viewed from the ultraviolet light irradiated side, of the semiconductor integrated circuit device 100 in accordance with the first embodiment of the present invention.

As shown in FIG. 1, the semiconductor integrated circuit device 100 includes a substrate 10, a PROM area 20 (element area) a multilayer wiring structure 70, a cover (passivation film) 40, a shield member 50, and the like. PROM (Programmable Read Only Memory) 22 is formed on the PROM area 20. The multilayer wiring structure 70 is formed on the same side of the substrate 10 as the PROM area 20 is formed. The cover 40 is arranged on the ultraviolet light irradiated side of the multilayer wiring structure 70. The shield member 50 is arranged on the ultraviolet light irradiated side of the cover 40. Incidentally, although the PROM 22 is shown as an example of a semiconductor memory element in this embodiment, the semiconductor memory element is not limited to PROMs. That is, any semiconductor memory element in which data is written and erased by the irradiation of light can be used in other embodiments. For example, UVEPROM (UV Erasable Programmable Read Only Memory) may be used as the semiconductor memory element. Furthermore, the present invention in one aspect is applicable to a semiconductor integrated circuit device containing a light sensitive semiconductor memory element (e.g. EPROM (Erasable Programmable Read Only Memory), EEPROM (Electronically Erasable and Programmable Read Only Memory)).

The PROM area 20 includes the PROM 22, input/output wiring 21 to connect the PROM area 20 externally, and the like. The PROM 22 includes a polysilicon gate (polysilicon gate electrode, gate electrode) 22A formed as a bulge on the substrate 10, a diffusion layer 22B formed in the peripheral area of the polysilicon gate 22A on the substrate 10, and the like.

The multilayer wiring structure 70 includes a transparent area 80 formed from transparent material at a position opposite to the PROM area 20. The transparent area 80 is used as a light guiding path from the outside of the multilayer wiring structure 70 to the PROM 22. Specifically, the transparent area 80 is formed by laminating a transparent insulating layer on a position opposite to the PROM area 20. That is, the transparent area 80 is formed by laminating a transparent insulating layer on the ultraviolet light irradiated side of the PROM area 20.

Furthermore, the multilayer wiring structure 70 includes a shield area 30 formed from shielding materials in the periphery of the transparent area 80. Specifically, the shield area 30 is formed by continuously laminating shielding materials such that the shield area 30 surrounds the periphery of the transparent area 80. That is, the shield area 30 is formed by continuously laminating shielding materials in the direction of the ultraviolet light radiation around the transparent area 80. In other words, the shield area 30 is continuously laminated toward the ultraviolet light irradiated side such that the shield area 30 surrounds the periphery of a PROM area 20. That is, the shield area 30 is continuously laminated upward on the substrate 10 such that the shield area 30 surrounds the periphery of a PROM area 20. Then, the highest points of the continuously-laminated shield area 30 from the substrate 10 define a horizontal plane.

More specifically, the shield area 30 includes an shielding contact plug 31 formed on the substrate 10 to surround the periphery of the PROM area 20 (i.e., the transparent area 80), an shielding first wiring layer 32 laminated on the contact plug 31 (i.e., on the ultraviolet light irradiated side of the contact plug 31), an shielding via plug 33 laminated on the first wiring layer 32, and an shielding second wiring layer 34 laminated on the via plug 33. The contact plug 31, first wiring layer 32, via plug 33, and second wiring layer 34 are collectively called "shield wall 302" hereinafter. As shown in FIGS. 1 and 2, the shield wall 302 is constructed such that one side of the transparent area 80 through which an ultraviolet light source irradiates the PROM area 20 is not covered. Furthermore the shield wall 302 is continuously formed around the PROM area 20. That is, the shield wall 302 is arranged to cover the entire lateral side of the transparent area 80 without any uncovered space.

Furthermore, as shown in FIG. 2, the shield area 30 includes an extending portion 30A which is extending along the input/output wiring 21 by a certain length. The extending portion 30A includes a wiring opening 30B to enable external wiring from the input/output wiring 21. Furthermore, the extending portion 30A has at least one corner portion 30C such that the input/output wiring 21 is wired through at least one corner. Specifically, the extending portion 30A is formed, by the shield wall 302, in a tubular shape with a roughly rectangular cross-section. Furthermore, the extending portion 30A is formed in the tubular shape having a bend at the corner portion 30C. Incidentally, although the extending portion 30A has one corner portion 30C in the embodiment shown in FIG. 2, the number and position of the corner portion 30C are not limited to those shown in the figure.

Furthermore, the multilayer wiring structure 70 includes a PAD portion 60 (electrode) on the outside of the shield area 30 in regard to the transparent area 80. Specifically, the PAD portion 60 is formed on a layer upper than the PROM area 20 in the laminating direction (i.e., ultraviolet light irradiated side of the PROM area 20). Furthermore, the PAD portion 60 is formed at the side of the shield area 30 in the same layer as the second wiring layer 34. The PAD portion 60 controls writing operation to the PROM 22. Incidentally, the position of the PAD portion 60 is not limited to the illustrated position.

The cover 40 has a concave opening portion 40A at a position corresponding to the PAD portion 60. Furthermore, the opening portion 40A has roughly the same plane shape as the PAD portion 60 when viewed from the ultraviolet light irradiation side. Then, the opening portion 40A is arranged such that the PAD portion 60 blocks the opening portion 40A. In this manner, the opening portion 40A is arranged over the PAD portion 60, so that the PAD portion 60 can act as a contact portion for a probe during the test, and as a contact portion for a metal bump. Furthermore, the cover 40 is formed in a concavity-convexity shape with a concave groove portion 40B located at a position corresponding to the second wiring layer 34. Incidentally, the cover 40 is made of transparent material to ultraviolet light.

The shield member 50 is, for example, made of polyimide. Furthermore, the shield member 50 is located at a position opposite to the transparent area 80 (i.e., a PROM area 20). Specifically, the shield member 50 is patterned on the cover 40 (i.e., ultraviolet light irradiation side of the cover 40) such that the shield member 50 covers the ultraviolet light irradiated side of the transparent area 80. More specifically, the shield member 50 is laminated, on the cover 40, continuously in a portion corresponding to the transparent area 80, and the groove portion 40B and a portion laterally extending from the groove portion 40B. That is, the groove portion 40B of the cover 40 is filled with the shield member 50. Therefore, the shield member 50 is patterned such that the shield member 50 covers the upper portion of the shield area 30 and the portion surrounded by the shield area 30 (i.e., a PROM area 20). Furthermore, the shield member 50 is formed continuously with the shield area 30. The shield member 50 formed in this manner is called "shield lid 303" hereinafter. The shield lid 303 is contacting with the horizontal plane which is connecting the highest points of the shield wall 302 from the substrate 10. That is, the side of the PROM 22 is covered by the shield wall 302, and the upper portion of the enclosure defined by the shield wall 302 is covered by the shield lid 303. Incidentally, the shield member 50 may be continuously formed, on the cover 40, only in a portion corresponding to the transparent area 80 and groove portion 40B. Furthermore, the shield member 50 (shield lid 303) is formed on the cover 40 after the writing test to the PROM 22 is carried out in the manufacturing process of the semiconductor integrated circuit device 100. Incidentally, the only requirement for the shield member 50 is that it is formed continuously with the shield area 30 on a layer upper than the PAD portion 60 in the laminating direction. Therefore, the position of the layer of the shield member 50 in the laminating direction is not limited to the position in this embodiment.

Figure 3:
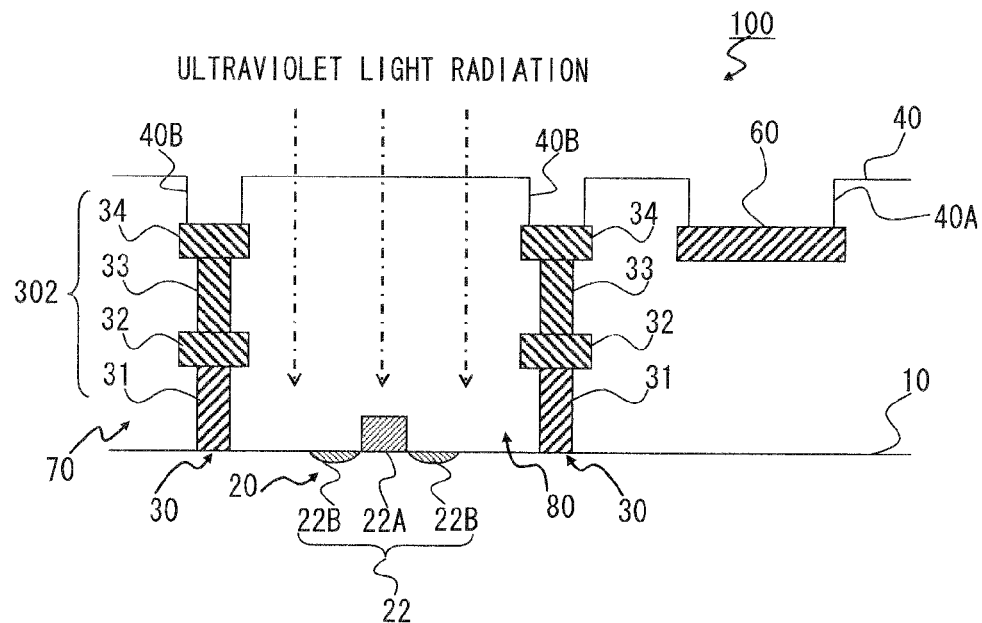
FIG. 3 is a side cross-sectional view illustrating the writing test state of a PROM of the semiconductor integrated circuit device in accordance with the first embodiment of the present invention.

Next, a method of manufacturing a semiconductor integrated circuit device 100 in accordance with this embodiment is explained hereinafter with reference to FIG. 3. FIG. 3 is a side cross-sectional view illustrating the writing test state of a PROM of the semiconductor integrated circuit device 100 in accordance with this embodiment of the present invention. Firstly, as shown in FIG. 3, a PROM area 20 is formed on a substrate 10 (device formation process). Then, while a transparent insulating layer is laminated on a position opposite to the PROM area 20 (i.e., ultraviolet light irradiated side of the PROM area 20) to form a transparent area 80, a contact plug 31, a first wiring layer 32, a via plug 33, and a second wiring layer 34 are laminated on the periphery of the transparent area 80 toward the ultraviolet light irradiated side (i.e., upward in the laminating direction) to form a shield area 30 (shield wall 302). Next, a PAD portion 60 is formed on the outside of the shield area 30 to the transparent area 80, and a cover 40 is also formed (wiring structure formation process). Next, writing test to the PROM 22 is carried out (testing process). Specifically, after writing operation and testing operation are carried out for the PROM 22 through the PAD portion 60, ultraviolet light is irradiated to the PROM 22 to erase the data written in the PROM 22 by the writing operation. Then, a shield member 50 (shield lid 303) is formed on the ultraviolet light irradiated side of the cover 40 to cover the transparent area 80 (shield formation process). Incidentally, a retention failure detection test of the PROM 22 may be carried out in similar manner during the testing process. Similarly to the writing test, the shield member 50 (shield lid 303) is formed on the cover 40 after the completion of the retention failure detection test.

Table 1 shows availabilities of each operation for the PROM 22 of a semiconductor integrated circuit device 100 to which one example of the present invention is applied. The availabilities are shown for semiconductor makers and customers (set makers and end users). In the table, "OK" means "available", and "UA" means "unavailable". As shown in Table 1, a semiconductor maker can carry out writing operation and erasing operation to the PROM 22, and thereby they can carry out writing test and retention failure detection test. Furthermore, in the case where a failure is detected in the writing test or retention failure detection test, they can carry out recovery procedure or screening. Consequently, they can ship semiconductor integrated circuit devices 100 and semiconductor chips having such defectiveness to a customer as non-defective products after the recovery procedure. Alternatively, they can prevent semiconductor integrated circuit devices and semiconductor chips having such defectiveness from being delivered to a customer.

|  | write | erase | write, retention failure |  |
| --- | --- | --- | --- | --- |
| semiconductor maker | OK | OK | recovery | screening |
| customer: set user | OK | UA | non-defective | — |
| customer: end user | UA | UA | non-defective | — |

Table 2 shows availabilities of each operation for the PROM of a semiconductor integrated circuit device in the related art. The availabilities are shown for semiconductor makers and customers (set makers and end users). As shown in FIG. 2, a semiconductor maker cannot carry out erasing operation to the PROM. Therefore, if a semiconductor maker carries out writing test or retention failure detection test, they cannot erase the data written in the PROM during the writing test or retention failure detection test since they cannot carry out the erasing operation. Therefore, if the semiconductor maker carries out writing test or retention failure detection test, it becomes a defective product since a customer (set maker) cannot carry out writing operation to the PROM. That is, the semiconductor maker cannot carry out writing test or retention failure detection test. Consequently, they cannot prevent semiconductor integrated circuit devices and semiconductor chips having such defectiveness from being delivered to a customer.

|  | write | erase | write, retention failure |  |
| --- | --- | --- | --- | --- |
| semiconductor maker | OK | UA | write | no test |
| customer: set user | OK | UA | defective | defective |
| customer: end user | UA | UA | defective | defective |

As explained above, in accordance with the first embodiment of the present invention, a semiconductor integrated circuit device 100 and a method of manufacturing the semiconductor integrated circuit device 100 includes a substrate 10 having a PROM 22 formed thereon in which the data memory state of the PROM 22 is changed by the irradiation of light, and a multilayer wiring structure 70 formed on the same side of the substrate 10 as the PROM 22 is formed. The multilayer wiring structure 70 is formed from transparent material at a position opposite to a PROM area 20 where the PROM 22 is formed. The multilayer wiring structure 70 includes a transparent area 80, a shield area 30 (shield wall 302), and a PAD portion 60. The transparent area 80 is used as a light guiding path from the outside of the multilayer wiring structure 70 to the PROM 22. The shield area 30 is formed, in the periphery of the transparent area 80, continuously from a first wiring layer 32 and a second wiring layer 34, a shielding via plug 33 connecting the first wiring layer 32 to the second wiring layer 34, and an shielding contact plug 31 connecting the first wiring layer 32 to the substrate 10. The PAD portion 60 is formed on the outside of the shield area 30 in regard to the transparent area 80, and controls the memory state of the PROM 22. In this manner, since the transparent area 80, which is used as the light guiding path, is not shielded just after the formation of the PAD portion 60, the erase operation can be carried out by irradiating light to the PROM 22 after tentative writing operation is carried out to the PROM 22 through the PAD portion 60. That is, writing test can be carried out for the PROM 22, for which a shielding measure should be taken. Therefore, writing test of the PROM 22 can be carried out during the manufacturing process of the semiconductor integrated circuit device 100. Accordingly, since the writing test can be carried out, only the required number of PROM 22 need to be formed in a semiconductor integrated circuit device 100, and thereby enabling the miniaturized design of the semiconductor integrated circuit device 100.

Furthermore, the shield member 50 is formed after the formation of the PAD portion 60. That is, since the shield lid 303 is formed on a layer upper than the PAD portion 60 to contact with the horizontal plane defined by the highest points of the shield wall 302 from the substrate 10, the PROM area 20 can be substantially completely shielded by forming the shield member 50 (shield lid 303) continuously with shield area 30 (shield wall 302) after the writing operation and erasing operation. Therefore, writing test can be carried out to the PROM 22 during the manufacturing process of a semiconductor integrated circuit device 100, and then the PROM area 20 can be substantially completely shielded after the writing test of the PROM 22.

Furthermore, shield area 30 (shield wall 302) needs to be equipped with a gap at the portion through which the input/output wiring 21 is externally wired, and it can be problematic because outside light may enter the PROM area 20 through the gap. However, the shield area 30 (shield wall 302) includes the extending portion 30A which is extending along the input/output wiring 21 by a certain length, and the extending portion 30A has at least one corner portion 30C such that the input/output wiring 21 is wired through at least one corner. Therefore, outside light, which otherwise would enters through the wiring opening 30B arranged to enable external wiring from the input/output wiring 21, is blocked by the corner portion 30C and cannot directly enter the PROM area 20, and thereby enabling more complete shielding of the PROM 22.

Incidentally, in the case where a PROM 22 reserved only for a semiconductor maker is mounted, a dedicated PAD portion as well as a normal PAD portion may be arranged, so that the reserved PROM 22 is controlled through the dedicated PAD portion, and a PROM 22 for a customer is controlled through the normal PAD portion. In this manner, the usage of the reserved PROM 22 can be restricted. Furthermore, an available PROM area can be also restricted by using a test mode in which a specific voltage sequence is applied to a particular normal PAD portion. Furthermore, although the second shield member 50 is to be made of polyimide in the above explanation, it may be formed from other materials having high light-shielding property. For example, the second shield member 50 may be formed from an insulating material having high light-shielding property.

Second Embodiment

Figure 4:
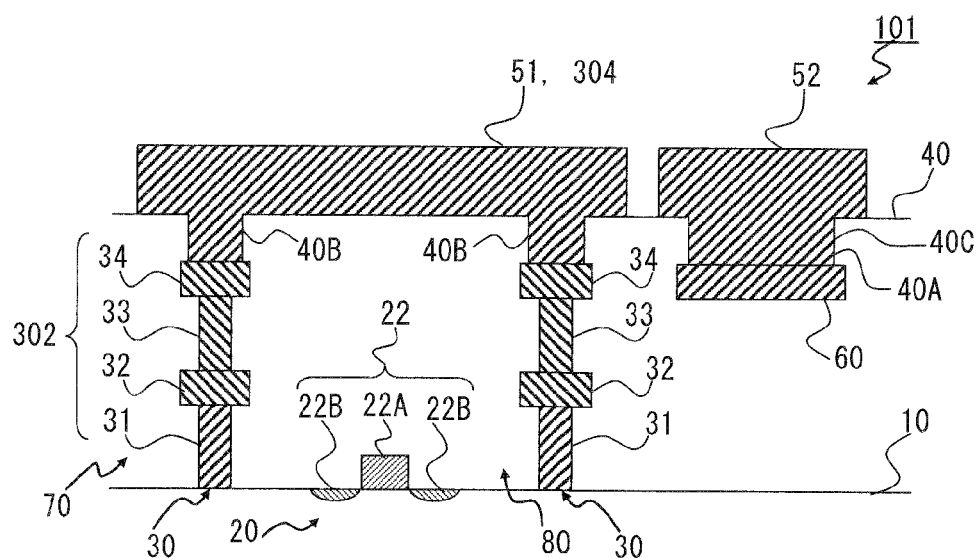
FIG. 4 is a side cross-sectional view showing the general structure of a semiconductor integrated circuit device in accordance with a second embodiment of the present invention.

A semiconductor integrated circuit device 101 in accordance with a second embodiment of the present invention is explained hereinafter with reference to FIG. 4. FIG. 4 is a side cross-sectional view showing the general structure of a semiconductor integrated circuit device 101 in accordance with a second embodiment of the present invention. Incidentally, since the structures of a substrate 10, a PROM area 20, a multilayer wiring structure 70, a cover 40, and a PAD portion 60 in the second embodiment of the present invention are the same as those in FIG. 1, the same signs are assigning to those components, and the explanation thereof is omitted.

As shown in FIG. 4, the semiconductor integrated circuit device 101 includes a substrate 10, a PROM area 20, a multilayer wiring structure 70, a cover 40, a shield member 51, a PAD portion 60, a PAD shield member 52, and the like. The PROM area 20 has a PROM 22 formed on the substrate 10. The multilayer wiring structure 70 is formed on the same side of the substrate 10 as the PROM area 20 is formed. The cover 40 is arranged on the ultraviolet light irradiated side of the multilayer wiring structure 70. The shield member 51 is arranged on the ultraviolet light irradiated side of the cover 40. The PAD shield member 52 is formed on the ultraviolet light irradiated side of the PAD portion 60.

The shield member 51 is formed, for example, from metal bump material such as gold. Furthermore, the shield member 51 is located at a position opposite to a transparent area 80 (i.e., a PROM area 20). Specifically, the shield member 51 is patterned on the cover 40 (i.e., ultraviolet light irradiated side of the cover 40) such that the shield member 51 covers the ultraviolet light irradiated side of the transparent area 80. More specifically, the shield member 51 is continuously laminated, on the cover 40, at a portion corresponding to the transparent area 80, and groove portion 40B and a portion laterally extending from the groove portion 40B. That is, the groove portion 40B of the cover 40 is filled with the shield member 51. Therefore, the shield member 51 is patterned such that the shield member 51 covers the upper portion of the shield area 30 and the portion surrounded by the shield area 30 (i.e., a PROM area 20). Furthermore, the shield member 51 is formed continuously with the shield area 30. The shield member 51 formed in this manner is called "shield lid 304" hereinafter. The shield lid 304 is contacting with the horizontal plane which is connecting the highest points of the shield wall 302 from the substrate 10. That is, the side of the PROM 22 is covered by the shield wall 302, and the upper portion of the enclosure defined by the shield wall 302 is covered by the shield lid 304. Incidentally, the shield member 51 may be continuously formed, on the cover 40, only in a portion corresponding to the transparent area 80 and groove portion 40B. Furthermore, the shield member 51 (shield lid 304) is formed on the cover 40 after the writing test to the PROM 22 is carried out in the manufacturing process of the semiconductor integrated circuit device 101. Incidentally, the only requirement for the shield member 51 is that it is formed continuously with the shield area 30 on a layer upper than the PAD portion 60 in the laminating direction. Therefore, the position of the layer of the shield member 51 in the laminating direction is not limited to the position in this embodiment.

Similarly to the shield member 51, the PAD shield member 52 is formed, for example, from metal bump material such as gold. The PAD shield member 52 is laminated, on the ultraviolet light irradiated side of the cover 40, in a concave portion 40C defined by the PAD portion 60 and opening portion 40A, and a portion laterally extending from the concave portion 40C. The PAD shield member 52 formed on the PAD portion 60 acts as a bump terminal.

As explained above, since the shield member 51 (shield lid 304) is formed from metal which has higher shielding property than polyimide, the PROM 22 can be shielded more completely in the semiconductor integrated circuit device 101 in accordance with the second embodiment of the present invention.

Third Embodiment

Figure 5:
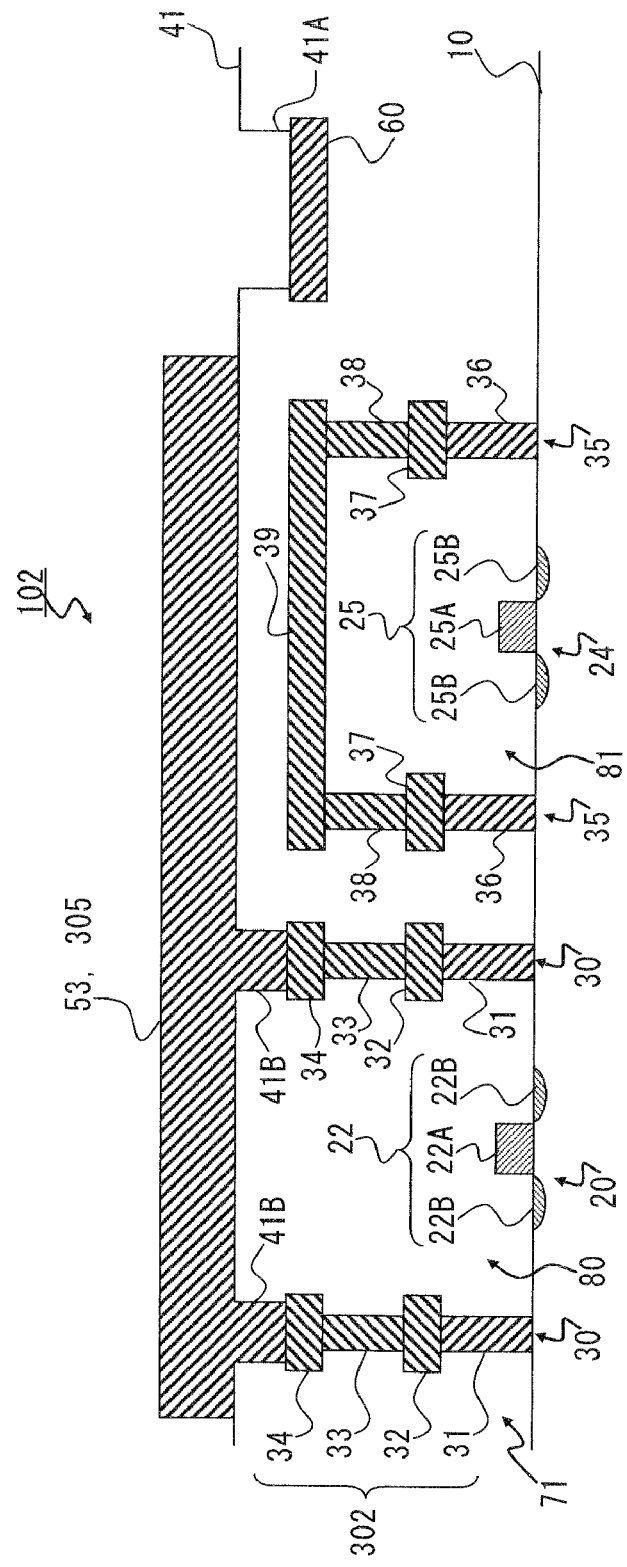
FIG. 5 is a side cross-sectional view showing the general structure of a semiconductor integrated circuit device in accordance with a third embodiment of the present invention.

A semiconductor integrated circuit device 102 in accordance with a third embodiment of the present invention is explained hereinafter with reference to FIG. 5. FIG. 5 is a side cross-sectional view showing the general structure of a semiconductor integrated circuit device 102 in accordance with a third embodiment of the present invention. Incidentally, since the structures of a substrate 10, a PROM area 20, and a PAD portion 60 in the third embodiment of the present invention are the same as those in FIG. 1, the same signs are assigning to those components, and the explanation thereof is omitted.

As shown in FIG. 5, the semiconductor integrated circuit device 102 includes a substrate 10, a multilayer wiring structure 71, a cover (passivation film) 41, a shield member 53, a PAD portion 60, and the like. A PROM area 20 (first element area) where a PROM 22 (first semiconductor memory element) is formed, and a PROM area 24 (second element area) where a PROM 25 (second semiconductor memory element) is formed are formed on the substrate 10.

The PROM area 24 includes the PROM 25, output wiring 21 (not shown) to connect the PROM area 24 externally, and the like. The PROM 25 includes a polysilicon gate (polysilicon gate electrode, gate electrode) 25A formed as a bulge on the substrate 10, a diffusion layer 25B formed in the peripheral area of the polysilicon gate 25A on the substrate 10.

The multilayer wiring structure 71 includes a transparent area 80 (first transparent area) formed at a position opposite to the PROM area 20, a shield area 30 (first shield area) formed at the periphery of the transparent area 80, a transparent area 81 (second transparent area) formed at a position opposite to the PROM area 24, a shield area 35 (second shield area) formed at the periphery of the transparent area 81 and at a position opposite to the transparent area 81, and a PAD portion 60. The transparent area 80 and shield area 30 are the same as those in FIG. 1, therefore the explanation thereof is omitted.

The transparent area 81 is formed from transparent material at a position opposite to the PROM area 24, and used as a light guiding path from the outside of the multilayer wiring structure 71 to the PROM 25. Specifically, the transparent area 81 is formed by laminating a transparent insulating layer on a position opposite to the PROM area 24. That is, the transparent area 81 is formed by laminating a transparent insulating layer on the ultraviolet light irradiated side of the PROM area 24.

The shield area 35 is formed from shielding materials such that the shield area 35 surrounds the periphery of the transparent area 81, and covers the ultraviolet light irradiated side of the transparent area 81. Specifically, the transparent area 81 includes an shielding contact plug 36 formed on the substrate 10 to surround the periphery of the PROM area 24, an shielding first wiring layer 37 laminated on the contact plug 36 (i.e., on the ultraviolet light irradiated side of the contact plug 36), an shielding via plug 38 laminated on the first wiring layer 37, and an shielding second wiring layer 39 laminated on the via plug 38. As shown in FIG. 5, the contact plug 36, first wiring layer 37, and via plug 38 are constructed such that the ultraviolet light irradiated side of the transparent area 81 is not covered. The second wiring layer 39 is arranged to cover the ultraviolet light irradiated side of the transparent area 81. Furthermore, the contact plug 36, first wiring layer 37, via plug 38, and second wiring layer 39 are continuously arranged at the periphery of the transparent area 81. That is, the contact plug 36, first wiring layer 37, via plug 38, and second wiring layer 39 are arranged to cover the side of transparent area 81 through which an ultraviolet light source irradiates the transparent area 81 and the lateral side of the transparent area 81 without any space therebetween. Then, the PAD portion 60 is formed on the outside of the shield area 30 and shield area 35 in regard to the transparent area 80 and transparent area 81.

The cover 41 has a concave opening portion 41A at a position corresponding to the PAD portion 60. Furthermore, the opening portion 41A has roughly the same plane shape as the PAD portion 60 when viewed from the ultraviolet light irradiation side. Then, the opening portion 41A is arranged such that the PAD portion 60 blocks the opening portion 41A. Furthermore, the cover 41 is formed in a concavity-convexity shape with a concave groove portion 41B located at a position corresponding to the second wiring layer 34. Incidentally, the cover 40 is made of transparent material to ultraviolet light.

The shield member 53 is, for example, made of polyimide. Furthermore, the shield member 53 is located at a position opposite to the transparent area 80 and transparent area 81. Specifically, the shield member 53 is patterned on the cover 41 such that the shield member 53 covers the ultraviolet light irradiated side of the transparent area 80 and transparent area 81. More specifically, the shield member 53 is continuously laminated, on the cover 41, in a portion corresponding to the transparent area 80, groove portion 41B, a portion laterally extending from the groove portion 41B, and a portion corresponding to the transparent area 81. That is, the groove portion 41B of the cover 41 is filled with the shield member 53. Therefore, the shield member 53 is patterned such that the shield member 53 covers the upper portion of the shield area 30 and the portion surrounded by the shield area 30 (i.e., a PROM area 20), and the upper portion of the shield area 35 and the portion surrounded by the shield area 35 (i.e., a PROM area 24). Furthermore, the shield member 53 is formed continuously with the shield area 30. The shield member 53 formed in this manner is called "shield lid 305" hereinafter. The shield lid 305 is contacting with the horizontal plane which is connecting the highest points of the shield wall 302 from the substrate 10. That is, the side of the PROM 22 is covered by the shield wall 302, and the upper portion of the enclosure defined by the shield wall 302 is covered by the shield lid 305. Incidentally, the shield member 53 may be continuously formed, on the cover 41, only in a portion corresponding to the transparent area 80 and groove portion 41B. Furthermore, the shield member 53 (shield lid 305) is formed on the cover 41 after the writing test to the PROM 22 is carried out in the manufacturing process of the semiconductor integrated circuit device 102. Incidentally, the only requirement for the shield member 53 is that it is formed continuously with the shield area 30 on a layer upper than the PAD portion 60 in the laminating direction. Therefore, the position of the layer of the shield member 53 in the laminating direction is not limited to the position in this embodiment.

Next, a method of manufacturing a semiconductor integrated circuit device 102 in accordance with this embodiment is explained. Firstly, a PROM area 20 and a PROM area 24 are formed on a substrate 10. Then, while a transparent insulating layer is laminated on a position opposite to the PROM area 20 (i.e., ultraviolet light irradiated side of the PROM area 20) to form a transparent area 80, a contact plug 31, a first wiring layer 32, a via plug 33, and a second wiring layer 34 are laminated on the periphery of the transparent area 80 toward the ultraviolet light irradiated side (i.e., upward in the laminating direction) to form a shield area 30 (shield wall 302).

Furthermore, while a transparent insulating layer is laminated on a position opposite to the PROM area 24 (i.e., ultraviolet light irradiated side of the PROM area 24) to form a transparent area 81, a shield area 35 is formed such that the shield area 35 cover the periphery of the transparent area 81 and the ultraviolet light irradiated side of the transparent area 81. Next, a PAD portion 60 is formed on the outside of the shield area 30 and shield area 35 to the transparent area 80 and transparent area 81, and a cover 41 is also formed. Next, writing test to the PROM 22 is carried out. Specifically, after writing operation and testing operation are carried out to the PROM 22 through the PAD portion 60, ultraviolet light is irradiated to the PROM 22 to erase the data written in the PROM 22 by the writing operation. At this point, since the PROM 25 is substantially completely shielded by the shield area 35, the data stored in the PROM 25 is not changed by the ultraviolet light radiation. Then, a shield member 53 (shield lid 303) is formed on the ultraviolet light irradiated side of the cover 41 to cover the ultraviolet light irradiated side of the transparent area 80 and transparent area 81. Incidentally, a retention failure detection test of the PROM 22 may be carried out in similar manner during the testing process. Similarly to the writing test, the shield member 53 (shield lid 305) is formed on the cover 41 after the completion of the retention failure detection test.

As explained above, since the PROM 25 is substantially completely shielded by the shield member 53 during writing test of the PROM 22, the data change in the PROM 25 caused by the ultraviolet light radiation can be prevented while writing test is carried out to the PROM 22 in a semiconductor integrated circuit device 102 in accordance with the third embodiment of the present invention.

Forth Embodiment

Figure 6:
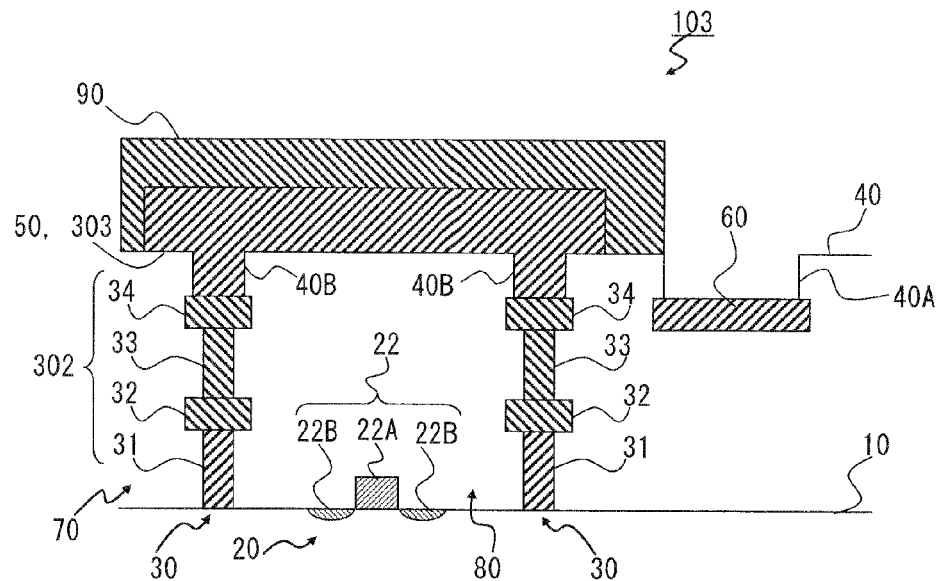
FIG. 6 is a side cross-sectional view showing the general structure of a semiconductor integrated circuit device in accordance with a forth embodiment of the present invention.

A semiconductor integrated circuit device 103 in accordance with a forth embodiment of the present invention is explained hereinafter with reference to FIG. 6. FIG. 6 is a side cross-sectional view showing the general structure of a semiconductor integrated circuit device 103 in accordance with a forth embodiment of the present invention. Incidentally, since the structures of a substrate 10, a PROM area 20, a multilayer wiring structure 70, a cover 40, a shield member 50 (shield lid 303), and a PAD portion 60 in the forth embodiment of the present invention are the same as those in FIG. 1, the same signs are assigning to those components, and the explanation thereof is omitted.

As shown in FIG. 6, the semiconductor integrated circuit device 103 includes a substrate 10, a PROM area 20 having a PROM 22 formed on the substrate 10, a multilayer wiring structure 70 formed on the same side of the substrate 10 as the PROM area 20 is formed, a cover 40 arranged on the ultraviolet light irradiated side of the multilayer wiring structure 70, a shield member 50 (shield lid 303) arranged on the ultraviolet light irradiated side of the cover 40, a PAD portion 60, upper layer wiring layer 90, and the like. The upper layer wiring layer 90 is formed on a layer upper than the shield member 50 (shield lid 303) in the laminating direction. As illustrated, the only requirement for the shield member 50 (shield lid 303) is to be formed on a layer upper than the PAD portion 60 in the laminating direction, and therefore the shield member 50 is not necessarily formed in the uppermost layer.

Fifth Embodiment

Figure 7:
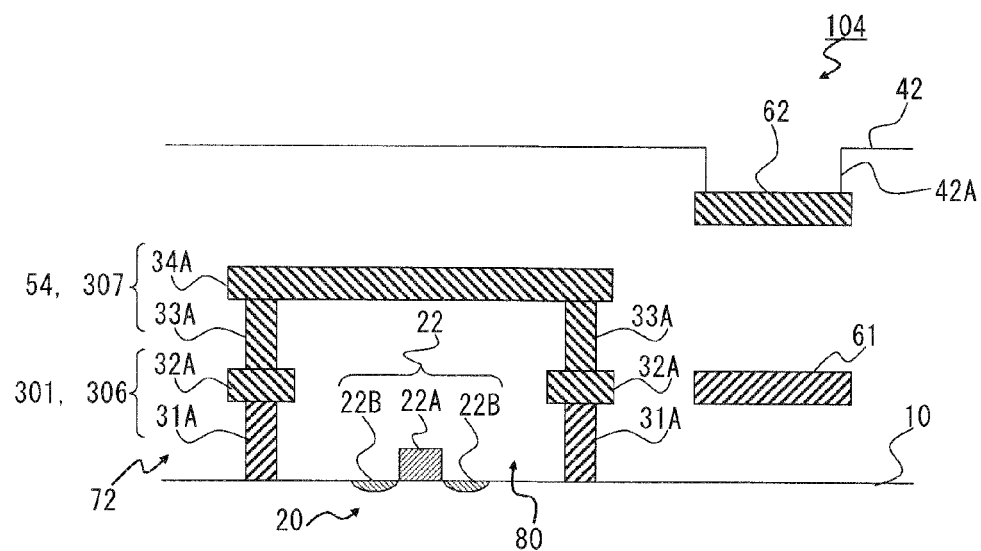
FIG. 7 is a side cross-sectional view showing the general structure of a semiconductor integrated circuit device in accordance with a fifth embodiment of the present invention.
Figure 8:
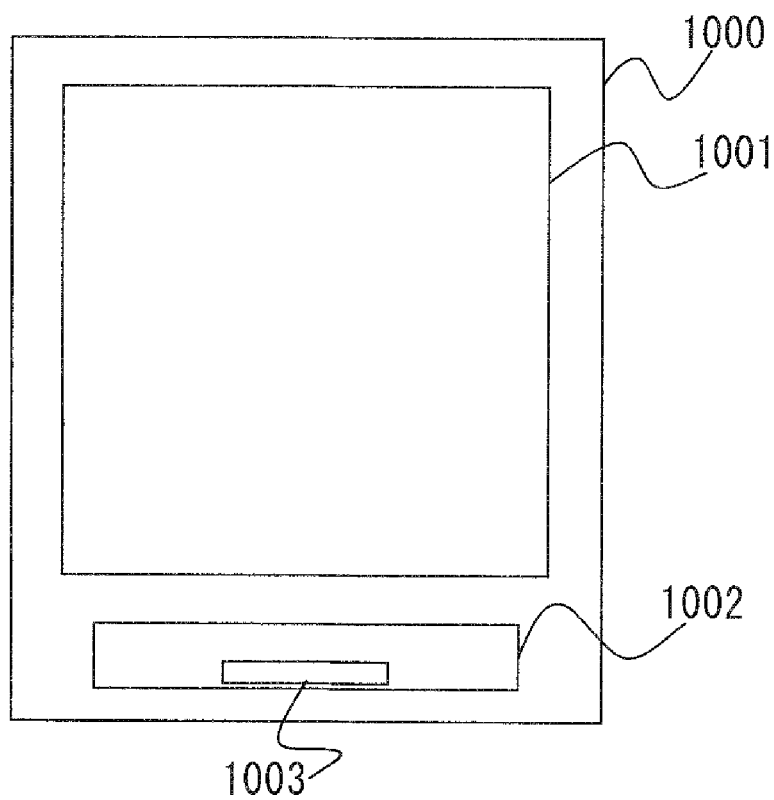
FIG. 8 is a plan view of an LCD substrate on which an LCD panel and a semiconductor integrated circuit device for use in an LCD driver in related art are mounted.

A semiconductor integrated circuit device 104 in accordance with a fifth embodiment of the present invention is explained hereinafter with reference to FIG. 7. FIG. 7 is a side cross-sectional view showing the general structure of a semiconductor integrated circuit device 104 in accordance with a fifth embodiment of the present invention. Incidentally, since the structures of a substrate 10, a PROM area 20, a transparent area 80 in the fifth embodiment of the present invention are the same as those in FIG. 1, the same signs are assigning to those components, and the explanation thereof is omitted. As shown in FIG. 7, the semiconductor integrated circuit device 104 includes a substrate 10, a PROM area 20 having a PROM 22 formed therein, a multilayer wiring structure 72 formed on the same side of the substrate 10 as the PROM area 20 is formed, and a cover 42 arranged on the ultraviolet light irradiated side of the multilayer wiring structure 72.

The multilayer wiring structure 72 includes a transparent area 80 and a shield area 301.

The shield area 301 is formed by continuously laminating shielding materials such that the shield area 301 surrounds the periphery of the transparent area 80. That is, the shield area 301 is formed by continuously laminating shielding materials in the direction of the ultraviolet light radiation around the transparent area 80. In other words, the shield area 301 is continuously laminated toward the ultraviolet light irradiated side such that the shield area 301 surrounds the periphery of a PROM area 20. That is, the shield area 301 is continuously laminated upward on the substrate 10 such that the shield area 301 surrounds the periphery of a PROM area 20.

More specifically, the shield area 301 includes an shielding contact plug 31A arranged on the substrate 10 to surround the periphery of the PROM area 20 (i.e., the transparent area 80), and an shielding first wiring layer 32A laminated on the contact plug 31A (i.e., on the ultraviolet light irradiated side of the contact plug 31A). The contact plug 31A and first wiring layer 32A are collectively called "shield wall 306", hereinafter. As shown in FIG. 7, the shield wall 306 is constructed such that one side of the transparent area 80 through which an ultraviolet light source irradiates the PROM area 20 is not covered. Furthermore the shield wall 306 is continuously formed around the PROM area 20. That is, the shield wall 306 is arranged to cover the entire lateral side of the transparent area 80 without any uncovered space. Furthermore, similarly to the first embodiment of the present invention, the shield area 301 includes an extending portion (not shown) which is extending along input/output wiring (not shown) by a certain length.

Furthermore, the multilayer wiring structure 72 includes a testing PAD portion 61 (electrode) on the outside of the shield area 301 in regard to the transparent area 80. Specifically, the testing PAD portion 61 is formed on a layer upper than the PROM area 20 in the laminating direction (i.e., ultraviolet light irradiated side of the PROM area 20). Furthermore, the testing PAD portion 61 is formed at the side of the shield area 301 in the same layer as the first wiring layer 32A. The testing PAD portion 61 controls writing operation to the PROM 22.

Furthermore, the multilayer wiring structure 72 includes a shield member 54 on a layer upper than the testing PAD portion 61 in the laminating direction. The shield member 54 is located at a position opposite to the transparent area 80 (i.e., a PROM area 20). Specifically, the shield member 54 is patterned to cover the ultraviolet light irradiated side of the transparent area 80. More specifically, the shield member 54 includes an shielding contact plug 33A laminated on the first wiring layer 32, and an shielding second wiring layer 34A laminated on the contact plug 33A. The second wiring layer 34A is patterned to cover the ultraviolet light irradiated side of the transparent area 80. The contact plug 33A and second wiring layer 34A are collectively called "shield lid 307" hereinafter. Furthermore, the shield lid 307 (shield member 54) is formed continuously with the shield wall 306 (shield area 301). That is, the contact plug 31A, first wiring layer 32A, contact plug 33A, and second wiring layer 34A are arranged to cover the side of transparent area 80 through which an ultraviolet light source irradiates the transparent area 80 and the lateral side of the transparent area 80 without any space therebetween. Furthermore, the shield member 54 (shield lid 307) is formed after the writing test of the PROM 22 in the manufacturing process of the semiconductor integrated circuit device 104. Incidentally, the only requirement for the shield member 54 is that it is formed continuously with the shield area 301 on a layer upper than the testing PAD portion 61 in the laminating direction. Therefore, the position of the shield member 54 in the laminating direction is not limited to the position in this embodiment. Furthermore, the shield member 54 may be formed from an insulating material having high light-shielding property.

Furthermore, the multilayer wiring structure 72 includes a normal PAD portion 62 (electrode) on the outside of the shield area 301 in regard to the transparent area 80. Specifically, the normal PAD portion 62 is formed on a layer upper than the PROM area 20 in the laminating direction (i.e., ultraviolet light irradiated side of the PROM area 20). Furthermore, the normal PAD portion 62 is formed at the side of the shield area 301 in the same layer as the second wiring layer 34A.

The cover 42 has a concave opening portion 42A at a position corresponding to the normal PAD portion 62. Furthermore, the opening portion 42A has roughly the same plane shape as the normal PAD portion 62 when viewed from the ultraviolet light irradiation side. Then, the opening portion 42A is arranged such that the normal PAD portion 62 blocks the opening portion 42A. In this manner, the opening portion 42A is arranged over the normal PAD portion 62, so that the normal PAD portion 62 can act as a contact portion for a probe, and as a contact portion for a metal bump. Incidentally, the cover 42 is made of transparent material to ultraviolet light.

Next, a method of manufacturing a semiconductor integrated circuit device 104 in accordance with this embodiment is explained hereinafter. Firstly, a PROM area 20 is formed on a substrate 10 (device formation process). Then, while a transparent insulating layer is laminated on a position opposite to the PROM area 20 (i.e., ultraviolet light irradiated side of the PROM area 20) to form a transparent area 80, a contact plug 31A and a first wiring layer 32A are laminated on the periphery of the transparent area 80 toward the ultraviolet light irradiated side (i.e., upward in the laminating direction) to form a shield area 301 (shield wall 306). Next, a PAD portion 61 is formed on the outside of the shield area 301 to the transparent area 80 (wiring structure formation process). Next, writing test to the PROM 22 is carried out (testing process). Specifically, after writing operation and testing operation are carried out to the PROM 22 through the testing PAD portion 61, ultraviolet light is irradiated to the PROM 22 to erase the data written in the PROM 22 by the writing operation. Then, a shield member 54 (shield lid 307) is formed on the ultraviolet light irradiated side of the transparent area 80 to cover the transparent area 80 (shield formation process). Specifically, a contact plug 33A is laminated on the first wiring layer 32A, and a second wiring layer 34A is laminated on the contact plug 33A. Furthermore, a normal PAD portion 62 is formed, on the outside of the shield area 301 to the transparent area 80, on a layer upper than the second wiring layer 34A. Then, a cover 42 is formed. Incidentally, a retention failure detection test of the PROM 22 may be carried out in similar manner during the testing process. Similarly to the writing test, a shield member 54 (shield lid 307) is formed on the shield area 301 after the completion of the retention failure detection test.

As illustrated, the only requirement for the shield member 54 is to be formed on a layer upper than the testing PAD portion 61 in the laminating direction, and therefore the shield member 54 may be formed within the multilayer wiring structure 72.

Furthermore, the only requirement for the shield area 301 is that it is formed from shielding materials laminated at the periphery of the transparent area 80, and therefore the shield area 301 is not limited to this embodiment.

As explained above, since the transparent area 80 which is used as a light guiding path is not shielded just after the formation of the testing PAD portion 61, the erase operation can be carried out by irradiating light to the PROM 22 after tentative writing operation is carried out to the PROM 22 through the testing PAD portion 61 in the semiconductor integrated circuit device 104 in accordance with the fifth embodiment of the present invention. That is, writing test can be carried out to the PROM 22, for which a shielding measure should be taken. Therefore, writing test of the PROM 22 can be carried out during the manufacturing process of the semiconductor integrated circuit device 104. Accordingly, since the test can be carried out, only the required number of the PROM 22 need to be formed in a semiconductor integrated circuit device 104, and thereby enabling the miniaturized design of the semiconductor integrated circuit device 104.

Furthermore, since the shield member 54 (shield lid 307) is formed after the formation of the testing PAD portion 61, the PROM area 20 can be substantially completely shielded by forming the shield member 54 continuously with shield area 301 after writing operation and erasing operation. Therefore, writing test can be carried out to the PROM 22 during the manufacturing process of the semiconductor integrated circuit device 104, and then the PROM area 20 can be substantially completely shielded after the writing test of the PROM 22.

Furthermore, since the normal PAD portion 62 is provided on a layer upper than the shield member 54 in the laminating direction, a desired data can be written to the PROM 22 after the shipment of the semiconductor integrated circuit devices 104.

It is apparent that the present invention is not limited to the above embodiments, but may be modified and changed without departing from the scope and spirit of the invention.

What is claimed is:

1. A semiconductor integrated circuit device comprising:
a substrate having a first semiconductor memory element formed on the substrate and a second semiconductor memory element formed on the substrate, data memory states of the first and second semiconductor memory elements being changed by the irradiation of light; and
a multilayer wiring structure formed on the same side of the substrate as the first and second semiconductor memory elements are formed;
wherein the multilayer wiring structure includes:
a first transparent area formed from transparent material at a position opposite to a first element area where the first semiconductor memory element is formed, the first transparent area being used as a light guiding path from the outside of the multilayer wiring structure to the first semiconductor memory element;
a first shield area continuously formed, in the periphery of the first transparent area, from shielding wiring arranged in several layers, an shielding via plug to connect between the shielding wiring arranged in several layers, and an shielding contact plug to connect the shielding wiring to the substrate;
a second transparent area formed from transparent material at a position opposite to a second element area where the second semiconductor memory element is formed, the second transparent area being used as a light guiding path from the outside of the multilayer wiring structure to the second semiconductor memory element;
a second shield area continuously formed, in the periphery of the second transparent area and at a position opposite to the second transparent area, from shielding wiring arranged in several layers, an shielding via plug to connect between the shielding wiring arranged in several layers, and an shielding contact plug to connect the shielding wiring to the substrate; and
an electrode to control the memory state of the first and second semiconductor memory elements, the electrode being formed on the outside of the first and second shield areas in regard to the first and second transparent areas; and
the semiconductor integrated circuit device further comprising a shield member to shield light entering from the outside of the multilayer wiring structure into the first transparent area, the shield member being located on a position opposite to the first transparent area,
wherein the shield member is formed continuously with the first shield area.

2. The semiconductor integrated circuit device according to claim 1, wherein the shield member is made of polyimide.

3. The semiconductor integrated circuit device according to claim 1, wherein the shield member is made of metal.

4. A semiconductor integrated circuit device comprising:
a photoresponsive device formed on a substrate;
a shield wall to surround the photoresponsive device in a fence-like manner so as to cover the entire lateral side of said photoresponsive device without any uncovered space on the substrate;
a shield lid to contact with the horizontal plane defined by the highest points of the shield wall from the substrate; and
an electrode that controls a memory state of the photoresponsive device, the electrode being outside an outer periphery of the shield wall.

5. The semiconductor integrated circuit device according to claim 4,
wherein the shield lid is farther from the substrate than the electrode.

6. The semiconductor integrated circuit device according to claim 4, wherein the shield wall includes a wiring opening.

7. The semiconductor integrated circuit device according to claim 5, wherein the shield wall includes a wiring opening.

8. The semiconductor integrated circuit device according to claim 4 further comprising a cover farther from the substrate than the horizontal plane,
wherein the cover includes a groove portion; and
the shield lid contacts with the horizontal plane through the groove portion of the cover.

9. The semiconductor integrated circuit device according to claim 4, wherein said photoresponsive device includes a PROM.

* * * * *